United States Patent
Malladi et al.

(10) Patent No.: US 7,403,054 B1
(45) Date of Patent: Jul. 22, 2008

(54) SUB-PICOSECOND MULTIPHASE CLOCK GENERATOR

(75) Inventors: Anjali R. Malladi, South Burlington, VT (US); Christopher Ro, Williston, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/951,217

(22) Filed: Dec. 5, 2007

(51) Int. Cl.
*H03K 7/06* (2006.01)

(52) U.S. Cl. .................. 327/158; 327/161; 327/244; 327/245

(58) Field of Classification Search .......... None
See application file for complete search history.

(56) References Cited

U.S. PATENT DOCUMENTS

| | | | |
|---|---|---|---|
| 4,734,910 A | 3/1988 | Izadpanah |
| 5,018,169 A | 5/1991 | Wong et al. |
| 5,057,771 A | 10/1991 | Pepper |
| 5,220,206 A | 6/1993 | Tsang et al. |
| 5,942,927 A | 8/1999 | Etheridge et al. |
| 6,388,753 B1 | 5/2002 | Hall et al. |
| 6,560,007 B2 | 5/2003 | Uchiyama et al. |
| 6,642,801 B1 | 11/2003 | Zortea et al. |
| 6,680,874 B1 | 1/2004 | Harrison |
| 6,842,399 B2 | 1/2005 | Harrison |
| 6,930,524 B2 | 8/2005 | Drexler |
| 7,024,122 B2 | 4/2006 | Uchiyama et al. |

(Continued)

FOREIGN PATENT DOCUMENTS

EP 1 653 652 A1 5/2006

(Continued)

OTHER PUBLICATIONS

Ahmed, S.I., et al., "A multiple-rotating-clock-phase architecture for digital data recovery circuits using Verilog-A," Conference: Proceedings of the 2005 IEEE International Behavioral Modeling and Simulation Workshop (IEEE Cat. No. 05TH8833), p. 112-117. Publisher: IEEE, Piscataway, NJ, USA, 2005, vii+145 Pages. Conference: Proceedings of the 2005 IEEE International Behavioral Modeling and Simulation.

(Continued)

*Primary Examiner*—Tuan T Lam
(74) *Attorney, Agent, or Firm*—Scully, Scott, Murphy & Presser, P.C.; W. Riyon Harding

(57) ABSTRACT

A circuit apparatus and method for generating multiphase clocks in a delay lock loop (DLL) at sub-picosecond granularity. The circuit and method of the invention involves locking a number of cycles M in an N stage DLL, e.g., M cycles, where M is an prime number, which results in clock edges in each cycle that are not located at the same phase locations in each of the M cycles. Any of the phase locations from any of the cycles can be used to generate a clock edge for all cycle in the system application. This requires a special technique to "lock" the DLL loop over a M cycle period instead of a one cycle period. The benefit is that it improves the clock placement granularity by a factor of M over the previous art.

1 Claim, 4 Drawing Sheets

U.S. PATENT DOCUMENTS

| | | | |
|---|---|---|---|
| 7,057,432 | B2 | 6/2006 | Yoo et al. |
| 7,187,242 | B2 | 3/2007 | Karlsson |
| 7,236,028 | B1 * | 6/2007 | Choi ........................ 327/158 |
| 2003/0117196 | A1 | 6/2003 | Uchiyama et al. |
| 2006/0002239 | A1 | 1/2006 | Gage et al. |
| 2006/0045222 | A1 | 3/2006 | Kim et al. |
| 2006/0255859 | A1 | 11/2006 | Zanchi et al. |
| 2007/0152723 | A1 * | 7/2007 | Ahn et al. ................... 327/158 |

FOREIGN PATENT DOCUMENTS

| | | |
|---|---|---|
| WO | WO 96/27943 | 9/1996 |
| WO | WO 02/17050 A2 | 2/2002 |

OTHER PUBLICATIONS

Bae, Y.-C., et al., "A mixed PLL/DLL architecture for low jitter clock generation," Conference: IEEE International Symposium on Circuits and Systems, (Vancouver BC CAN), 2004, Publication Date: 2004, p. 788-791. Publisher: IEEE Piscataway, New Jersey. PASCAL. Dialog® File No. 144 Accession No. 17839795. Abstract Only.

Chang, H.-H., et al., "A wide-range and fixed latency of one clock cycle delay-locked loop," Conference: SCAS : symposium on circuits and systems, (Phoenix-Scottsdale AZ USA) , May 26, 2002. Publication Date: 2002, p. III.675-III.678. Publisher: IEEE Piscataway NJ. PASCAL. Dialog® File No. 144 Accession No. 16630433. Abstract Only.

Chen, Kuo-Hsing, et al., "A fast-lock DLL with power-on reset circuit," Conference: IEEE International Symposium on Circuits and Systems, (Vancouver BC CAN), 2004, Publication Date: 2004, p. 357-360, Publisher: IEEE Piscataway, New Jersey. PASCAL. Dialog® File No. 144 Accession No. 17839687. Abstract Only.

Chung, Daehyun, "Chip-package hybrid clock distribution network and DLL for low jitter clock delivery," IEEE International Solid-State Circuits Conference (ISSCC 2005), (San Francisco, CA, USA, Feb. 6-10, 2005), Conference: IEEE International Solid-State Circuits Conference, (San Francisco, CA USA) , Feb. 6, 2005. IEEE journal of solid-state circuits, 2006, vol. 41, No. 1, p. 274-286. PASCAL. Dialog® File.

Coban, A.L., et al., "A 2.5-3.125-Gb/s quad transceiver with second-order analog DLL-based CDRs," Conference: IEEE 2004 Custom Integrated Circuits Conference (CICC 2004), (Orlando, FL USA), Oct. 3, 2004, IEEE journal of solid-state circuits, 2005, vol. 40, No. 9, p. 1940-1947. PASCAL. Dialog® File No. 144 Accession No. 17354394. Abstract Only.

Garleep, B., et al., "A Portable Digital DLL Architecture for CMOS Interface Circuits," Conference: VLSI circuits—Symposium, Symposium on VLSI Circuits, 1998, p. 214-215. Publisher: IEEE, 1998. Dialog® File No. 65 Accession No. 2471745. Inside Conferences Item ID: CN025808856. Abstract Only.

Hwang, Chorng-Sii, et al., "A wide-range and fast-locking clock synthesizer IP based on delay-locked loop," Conference: IEEE International Symposium on Circuits and Systems, (Vancouver BC CAN), 2004., Publication Date: 2004, p. 785-788. Publisher: IEEE Piscataway, New Jersey. PASCAL. Dialog® File No. 144 Accession No. 17839021. Abstract Only.

IEEE, "4.6 Digitally-Controlled DLL and I/O Circuits for 500Mb/s/pin ×16 DDR SDRAM," Conference: International solid-state circuits conference; digest of technical papers, Digest of Technical Papers of the Solid State Circuits Conference, 2001, p. 68-69, Publisher: IEEE, 2001. Abstract Only.

IEEE2, Proceedings of the IEEE 2006 Custom Integrated Circuits Conference (IEEE Cat No. 06CH37753C), Publisher: IEEE, Piscataway, NJ, USA, 2006, CD-ROM Pages. Conference: Proceedings of the IEEE 2006 Custom Integrated Circuits Conference, Sep. 10-13, 2006, San Jose, CA, USA, Dialog® File No. 2 Accession No. 10464562. Abstract Only.

Kim, K., et al., "An unlimited lock range DLL for clock generator," Conference: IEEE International Symposium onCircuits and Systems, (Vancouver BC CAN), 2004 Publication Date: 2004, p. 776-779, Publisher: IEEE Piscataway,New Jersey. PASCAL. Dialog® File No. 144 Accession No. 17839792. Abstract Only.

Kim, Byung-Guk, "A 250MHz-2GHz wide range delay-locked loop," Proceedings of the IEEE 2004 custom integrated circuits conference: Orlando, Florida, Oct. 3-6, 2004. Publication Date: 2004, p. 139-142. Publisher: Institute of Electrical and Electronics Engineers Piscataway NJ. PASCAL. Dialog® File No. 144 Accession No. 17460940. Abstract Only.

Lee, J-B., et al., "Digitally-controlled DLL and I/O circuits for 500 Mb/s/pin *16 DDR SDRAM," Conference: 2001 IEEE International Solid-State Circuits Conference. Digest of Technical Papers. ISSCC (Cat. No. 01CH37177), p. 68-9, 431, Publisher: IEEE, Piscataway, NJ, USA, 2001, 495 Pages. INSPEC. Dialog® File No. 2 Accession No. 7912649. Abstract Only.

Lee, H., et al., "Burst mode packet receiver using a second order DLL," Conference: Symposium on VLSI Circuits, 18, (Honolulu HI USA), 2004. Publication Date: 2003 p. 264-267. Publisher: IEEE Piscataway NJ; Business Center for Academic Societies Tokyo. PASCAL. Dialog® File No. 144 Accession No. 17691491. Abstract Only.

Perrott, M.H., "Fast and Accurate Behavioral Simulation of Fractional-N Frequency Synthesizers and other PLL/DLL Circuits," Conference: Design automation—Conference; 39th , Design Automation Conference, 2002; 39th, p. 498-503. Publisher: ACM, 2002. Dialog® File No. 65 Accession No. 4212162. Inside Conferences Item ID: CN044189239. Abstract Only.

Rashidzadeh, Rashid, et al., "On-chip measurement of waveforms in mixed-signal circuits using a segmented subsampling technique," Analog Integrated Circuits and Signal Processing, vol. 50, No. 2, p. 105-13. Publisher: Kluwer Academic Publishers, Feb. 2007.Dialog® File No. 2 Accession No. 10416256. Abstract Only.

Schaub, J.D., et al., "13GHz On-chip Oscilloscope with Sub-picosecond Resolution Using Asynchronous Clock," in: International SOI Conference, 2006 IEEE, Date: Oct. 2006, pp. 123-124, INSPEC Accession No. 9220741. DOI: 10.1109/SOI.2006.284466. Posted online: Jan. 15, 2007 13:06:56.0. http://ieeexplore.iee.org/search/srchabstract.jsp?arnumber=4062914&isnumber=4062842 &punumber=4062841&k2dockey=4062914@ieeecnfs &query=%28+%28+sub-picosecond%3Cin%3Emetadata+%29+%3Cand%3E+28+clock%3-Cin%3Emetadata+%29+%29%3Cand%3E+%28+generator%3-Cin%3Emetadata+%29&pos=0. Abstract Only.

* cited by examiner

| BEFORE | AFTER | BEFORE | AFTER |
|--------|-------|--------|-------|
| T0 | T0 | T16 | T16 |
| T1 | T11 | T17 | T27 |
| T2 | T22 | T18 | T6 |
| T3 | T1 | T19 | T17 |
| T4 | T12 | T20 | T28 |
| T5 | T23 | T21 | T7 |
| T6 | T2 | T22 | T18 |
| T7 | T13 | T23 | T29 |
| T8 | T24 | T24 | T8 |
| T9 | T3 | T25 | T19 |
| T10 | T14 | T26 | T30 |
| T11 | T25 | T27 | T9 |
| T12 | T4 | T28 | T20 |
| T13 | T15 | T29 | T31 |
| T14 | T26 | T30 | T10 |
| T15 | T5 | T31 | T21 |

SUB-PICOSECOND MULTIPHASE CLOCK GENERATOR

BACKGROUND OF THE INVENTION

1. Field of the Invention

The present invention relates generally to multi-phase clock generator circuits and more particularly to a novel delay locked loop (DLL) circuit providing a multi-phase clock using a same amount of delay stages in DLL but producing smaller clock spacing resolution than the propogation delay of delay stages in DLL.

2. Description of the Prior Art

Multi-phase clock is generated through delay locked loop (DLL). Spacing or resolution between these clocks are limited to the propagation delay of each stage in DLL.

FIG. 1 is a prior art DLL circuit 10 showing the current method of generating a Phase Shifted clock using a DLL. In this circuit 10, comprising a N stage DLL, e.g., N=32, the phase shift is equal to Tck/N where the Tck is the "locked" clock cycle and N is the number of stages. That is:

Tpd=Tck/N, where Tpd is limited to the propagation delay of each stage.

It would be highly desirable to provide a circuit apparatus and method of providing a phase shifted clock at sub-picosecond granularity wherein the time difference between rising clock edge appearance between each delay stage is Tpd/M, where M is equal to the number of clock cycles captured within the DLL and Tpd is the propagation delay of each delay stage.

It would be highly desirable to provide a DLL circuit apparatus and method for capturing M clock cycles where M is an odd number (greater than one) of clock cycles (e.g., 3 or 5 clocks) in the DLL.

It would be highly desirable to provide a DLL circuit apparatus and method for capturing M number of clock cycles, the number of clock cycles is a prime number greater than 1 that would provide a multi-phase clock resolution in an N-stage DLL that is less than the propagation delay of a single stage.

SUMMARY OF THE INVENTION

In one aspect, the invention comprises a DLL circuit apparatus and method of providing a multi-phase shifted clock at sub-picosecond granularity wherein the multi-phase clock resolution in an N-stage DLL that is less than the propagation delay of a single stage.

In one embodiment, the DLL circuit apparatus and method includes an N-stage DLL for capturing M clock cycles where M is an odd number (greater than one) of clock cycles (e.g., 3 or 5 clocks) in the DLL such that N=xM where x is a non-integer value.

Alternately, there is provided a DLL circuit apparatus and method for capturing M number of clock cycles in an N-stage DLL, the number of clock cycles being a prime number greater than 1 such that N=xM where x is a non-integer value.

In any embodiment, there is provided an N-stage DLL circuit apparatus and method of providing a phase shifted clock at sub-picosecond granularity wherein the time difference between the rising clock edge appearance between each delay stage is Tpd/M, where M is equal to the number of clock cycles captured by the DLL and Tpd is the propagation delay of each delay stage and N=xM where x is a non-integer value. This time difference between the clock edge appearance between the delay stages is less than the propagation delay of each delay stage in the DLL, Tpd.

More particularly, the circuit and method of the invention involves locking a number of cycles M in an N stage DLL, e.g., M cycles, where M is an prime number, which results in clock edges in each cycle that are not located at the same phase locations in each of the M cycles. Any of the phase locations from any of the cycles can be used to generate a clock edge for all cycle in the system application. This requires a special technique to "lock" the DLL over a M cycle period instead of a one cycle period when N=xM where x is a non-integer value. The benefit is that it improves the clock placement granularity by a factor of M over the previous art.

Thus, according to the invention, there is provided a sub-picosecond clock generator comprising:

an N-stage delay locked loop (DLL) having N serially connected variable delay stages and including phase detector feedback control device for controlling a delay of the N-stages to lock a clock input signal therein, the DLL initially receiving a clock signal (CLK/M) input equal to a clock input signal (CLK) divided by M, where M is a prime number greater than 1 and N=X·M and X is a non-integer value>1, and locking a CLK/M signal;

a counter device receiving the CLK signal and counting a predetermined time corresponding to a time for locking said single CLK/M signal in the DLL and asserting a switch signal at the predetermined time;

a synchronization device responsive to the asserted switch signal for switching the DLL input from the CLK/M to the CLK signal, and during input of a first CLK signal to the DLL generating a signal for temporarily halting the phase detector feedback control device from performing the DLL locking operation while enabling injection of M clock cycles in the DLL during the temporary halting, the synchronization device further enabling the phase detector feedback control device to resume the DLL locking operation at a time corresponding to input of the Mth additional CLK signal such that the N-stage delay locked loop locks M number of CLK clock signals to form multiphase clock outputs having Tpd/M clock spacing, where Tpd is a propagation delay of each DLL stage.

Relatedly, in one aspect, there is provided a design structure embodied in a machine readable medium used in a design process, the design structure comprising:

a sub-picosecond clock generator comprising:

an N-stage delay locked loop (DLL) having N serially connected variable delay stages and including phase detector feedback control device for controlling a delay of the N-stages to lock a clock input signal therein, the DLL initially receiving a clock signal (CLK/M) input equal to a clock input signal (CLK) divided by M, where M is a prime number greater than 1 and N=X·M and X is a non-integer value>1, and locking a CLK/M signal;

a counter device receiving the CLK signal and counting a predetermined time corresponding to a time for locking said single CLK/M signal in the DLL and asserting a switch signal at the predetermined time;

a synchronization device responsive to the asserted switch signal for switching the DLL input from the CLK/M to the CLK signal, and during input of a first CLK signal to the DLL generating a signal for temporarily halting the phase detector feedback control device from performing the DLL locking operation while enabling injection of M clock cycles in the DLL during the temporary halting, the synchronization device further enabling the phase detector feedback control device to resume the DLL locking operation at a time corresponding to input of the Mth additional CLK signal such that the N-stage delay locked loop locks M number of CLK clock signals to form multiphase clock outputs having Tpd/M clock spacing, where Tpd is a propagation delay of each DLL stage.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

The present invention provides a novel multi-phase clock generator circuit having sub-pico-second granularity and method for generating multi-phase clock signals.

In any embodiment, there is provided a DLL circuit apparatus and method of providing a phase shifting clock at sub-picosecond granularity wherein the time difference between rising clock edge appearance between each delay stage is Tpd/M, where M is equal to the number of clock cycles generated by the DLL and Tpd is the propagation delay of each delay stage. This time difference between the clock edge appearance (i.e., clock spacing) between the delay stages is less than the propagation delay of each delay stage in the DLL, e.g., in the sub-picosecond range.

More particularly, the circuit and method of the invention involves locking a number of cycles M in an N stage DLL, e.g., M cycles, where M is an prime number, which results in clock edges in each cycle that are not located at the same phase locations in each of the M cycles. Any of the phase locations from any of the cycles can be used to generate a clock edge for all cycle in the system application. This requires a special technique to "lock" the loop over a M cycle period instead of a one cycle period. The benefit is that it improves the clock placement granularity by a factor of M over the previous art.

Figure 1:
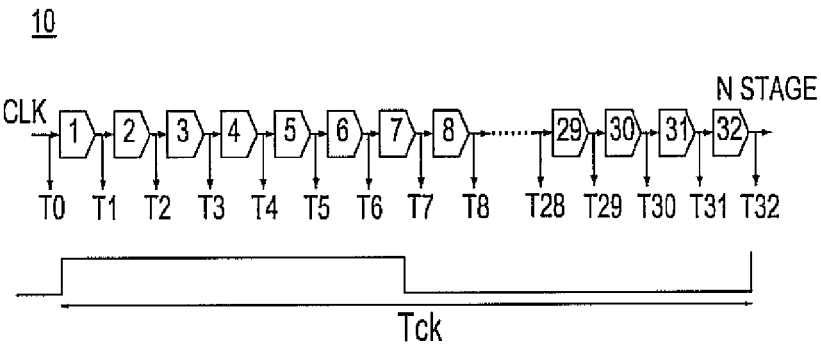
FIG. 1 is a circuit diagram depicting conceptually a prior art DLL circuit 10 showing the current method of generating a Phase Shifted clock using a DLL.
Figure 2:
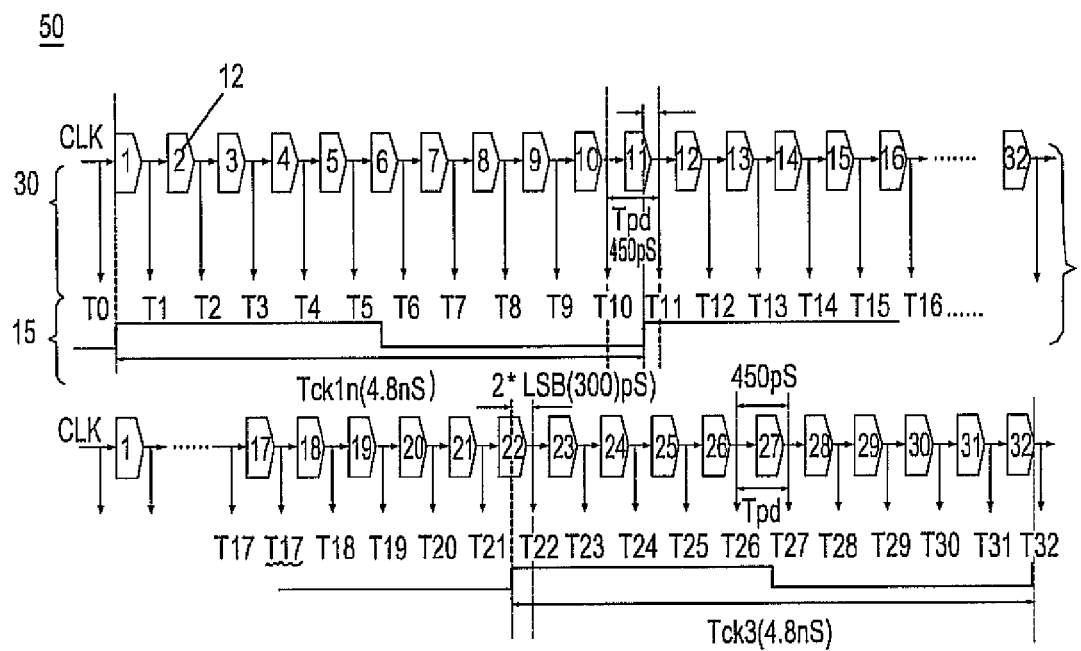
FIG. 2 is a circuit diagram depicting a multi-phase DLL circuit 50 in an example embodiment of the invention.

The present invention comprises a multi-phase DLL circuit 50 such as the example 32-stage DLL circuit 50 shown in FIG. 2 that captures a number M of clock cycles (3 or 5 clocks, for example) in the DLL. FIG. 2 shows a DLL 50 with multiple clocks (M clocks 15, e.g., where M=3) captured in the DLL.

Under this condition, the edges of each clock captured appears one at a time between each delay stages in the DLL. The time difference between the clock edge appearance between the delay stages is less than the propagation delay of each delay stage 12 in the DLL 50. For the circuit 50 shown in FIG. 2, constituting a N-stage DLL delay stage, e.g., a N=32 (T0, ..., T32) DLL, each delay stage has a propagation delay, Tpd, of about 450 pS (Tpd=450 pS) resulting in a delay line total, Ttotal, of about 14.4 nS. However, the time difference between rising edge appearance between each delay stage is Tpd/M, for example, where M is equal to the number of clock cycles generated by the DLL 50. In the example shown, M=3 clock cycles 15 are shown, each at a period, Tck, of about 4.8 nS.=150 pS. As a result, the resolution of the clock is increased.

Any of the phase locations from any of the cycles can be used to generate a clock edge for all clock cycles generated in the system application. This requires a special technique to "lock" the loop over a M cycle period instead of a one cycle period. The benefit is that it improves the clock placement granularity by a factor of M over the previous art.

More generally, the invention is a circuit apparatus described herein below with respect to FIG. 5 and method that provides a finer granularity of clock edge placement in a delay locked loop (DLL) than would be possible using an integer number of delay stages (N) that would normally divide the single cycle "locked period" by that integer N.

Figures 3, 4:
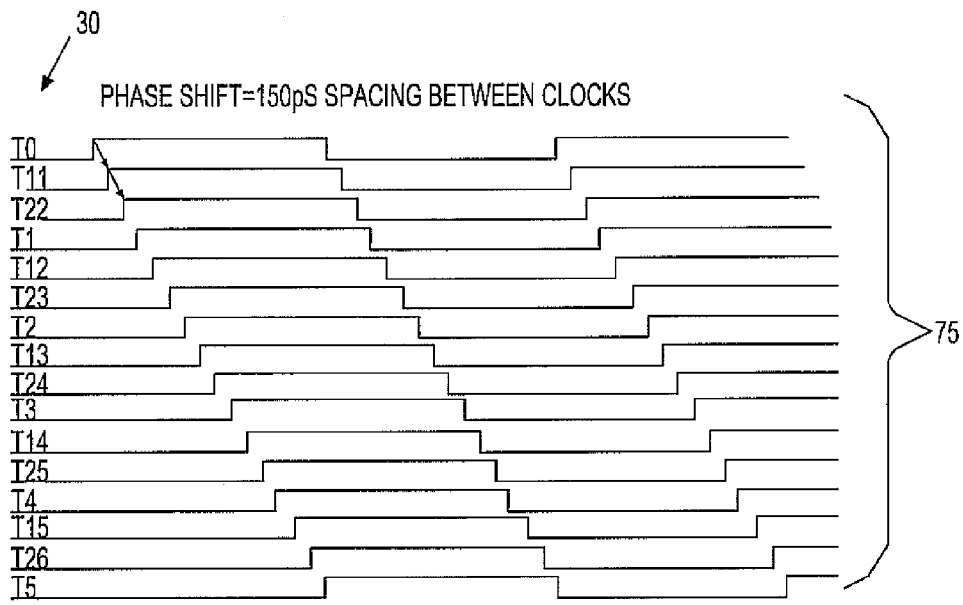
FIG. 3 depicts the re-ordering of the delay stage outputs to generate a multi-phase clocks in an example embodiment of the invention.
FIG. 4 depicts an example clock view after tapping off the DLL according to the re-arrangement depicted in FIG. 3.

In view of this, by re-ordering the outputs of delay stage, generation of multi-phase clocks is possible. FIG. 3 shows how re-ordering of the delay stage outputs can be done to generate a multi-phase clocks. That is, FIG. 3 shows one example re-arrangement showing the rotation of the T0-T31 (N=32) tap points 30 for the 32-stage stage DLL 50 of FIG. 2. The re-ordering of the N=32 tap points 30 results in the generation of multiphase clock signals 75 for system applications as shown in FIG. 4 after their re-arrangement (tap off the DLL)+FIG. 4 particularly shows how the multiphase clocks 75 will look once re-ordering is performed. The example clock views after re-arrangement depicted in FIG. 4 is for the M=3, clock input is 200 NMz. As shown, the spacing of each clock edge is 150 pS which is M=3 times smaller than the propagation delay of each delay stage of 450 pS in the example DLL of FIG. 3.

Once N (=# of delay stages/elements) and M (=# of clock cycles in DLL) are known, the re-ordering of timing tap points can be determined by calculating cumulative delay of each delay stage and figuring out where are the edges (preferably rising edge) are relative to the cumulative delay of each delay stage. The re-ordering always start with T0 and next timing tap point is located where the next edge of the clock (deeper into the delay line) will appear between two delay stages. In this case, timing tap point T11 will have a clock edge appearing 150 pS later. FIG. 2 shows this example. Similarly, next timing tap point is located further into the DLL where 3$^{rd}$ clock cycle can be found. In this case, timing tap point T22 will have a clock edge appearing 150 pS after the clock edge passes through T11. In this example, only 3 clock cycles are used so re-ordering goes back to T1 and rotates the timing tap point as shown in FIG. 3.

Figure 5:
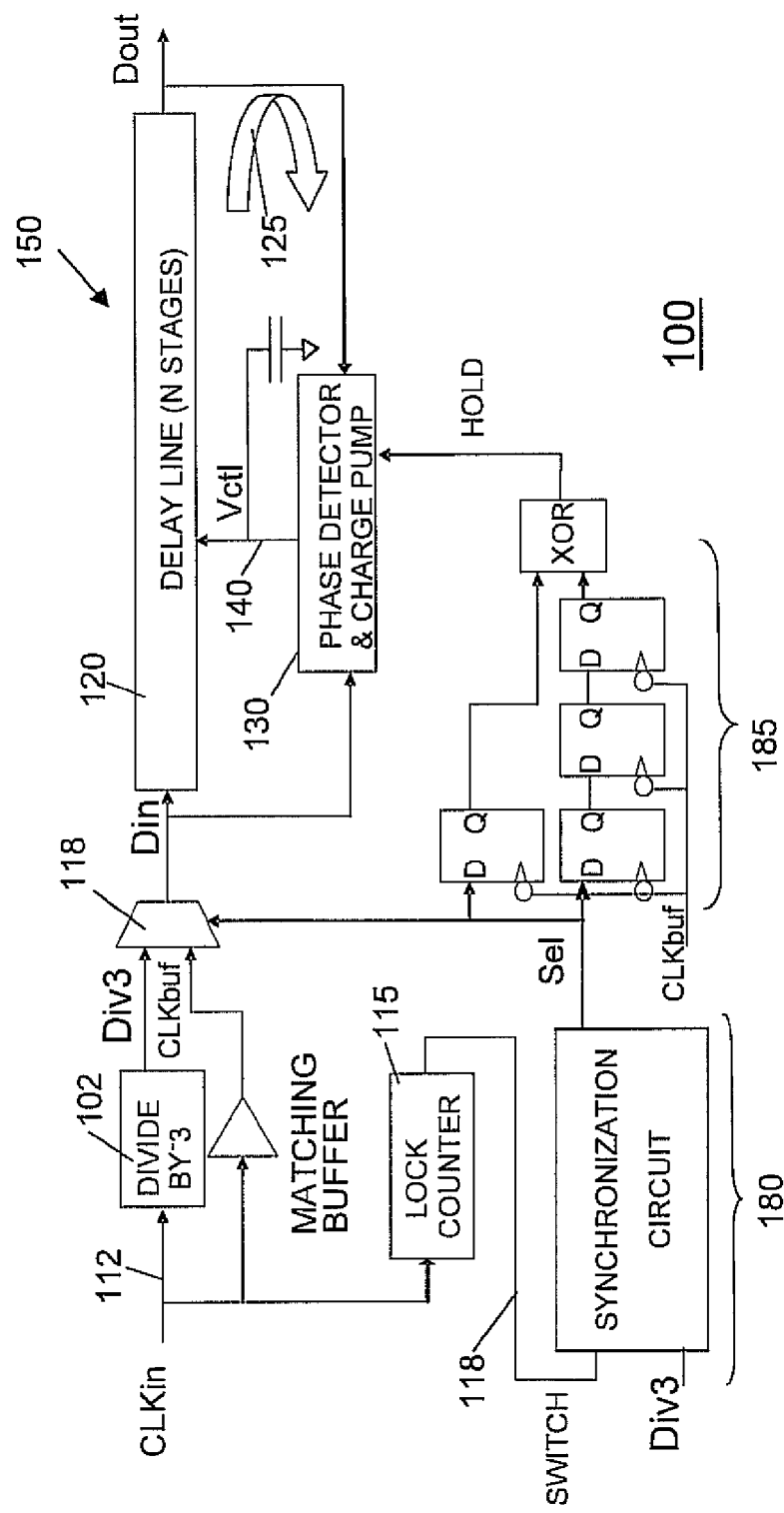
FIG. 5 is a circuit depiction of one implementation of the multi-phase generator circuit apparatus 100 providing multi-phase clocks with sub-picosecond resolution (clock spacing) of the invention; and, FIG. 6 is a flow diagram of a design process used in semiconductor design, manufacturing, and/or test of the multi-phase DLL circuit of the invention.

FIG. 5 is a circuit depiction of one implementation of the multi-phase clock generator circuit apparatus 100 providing multi-phase clocks with sub-picosecond resolution (clock spacing) of the invention. The locking of the number M of clock cycles of sub-picosecond resolution (clock spacing) in the N-delay stage DLL may be accomplished as a series of operations. In a first set of operations, for an example DLL circuit 150 locking an example M=3 clock cycles, during the initial locking, a divide-by-3 circuit 102 is employed that divides the CLKin signal 112 before it enters the DLL circuit. As shown in FIG. 5, a DLL 150 includes a delay line 120 and feedback control loop 125 including a Phase Detector/Charge Pump and Capacitor elements circuit 130 providing a control signal Vctl 140 for controlling the locking operation of the DLL 150. A lock counter 115 is clocked with CLKin by a predetermined amount based on the time it takes for the DLL to lock. During a first set of operations, the "Switch" signal and the "Sel" signal are initially set equal to a logic '0', and a synchronization circuit 180 having, for example, a series connection of latches that are initially cleared so that signals "Q" and "Hold" shown in FIG. 5 are at respective logic levels Q=0 and Hold=0. The DLL operation is then initiated with minimum delay such that total delay through the delay line<Din period. During DLL locking, the delay line is slowed down through feedback control signal Vctl 140 until Dout phase=Din phase and exactly a single cycle of Din is captured in the delay line.

In a second set of operations, at a predetermined time, corresponding to the lock time of the DLL using a CLKin/3 (Signal "Div3"), the Switch signal is set to logic '1'. Synchronization circuit 180 is used to synchronize the Sel line with the inputs to the Multiplexer (Mux) element 118 to avoid glitching. The Sel becomes logic '1' which switches the Mux 118 to send the CLKbuf into the DLL 150. Shortly thereafter, on a 1st falling edge of "CLKbuf" signal, the Hold signal is set to logic '1' to temporarily disable the phase detector/charge pump. This provides time for the delay line to fill-up with three (3) more CLKbuf cycles before making any change to the control voltage Vctl signal. Three (3) latches 185 are implemented to ignore interim comparisons between Din and Dout until the delay line is cleared of Div3 clocks and fill of CLKbuf clocks. Before the 3rd rising edge of CLKbuf after the Mux switch, the Hold is again set to logic '0' which enables the DLL again.

In a third set of operations, the DLL now contains M=3 cycles of CLKbuf, and will only lock to the 3rd edge. Thus, some additional lock time may be required (after switching from Div3 clock to the regular clock for the charge pump to settle) as the delay line reacts to the faster clock frequency, but Dout quickly becomes phase-aligned to Din. Once this is reached, the N-stage DLL has locked M cycles (e.g., M=a prime number, such as 3).

Generally, the apparatus 100 of FIG. 5 may be configured to enable locking to M clock cycles by providing a divide-by-M counter 102 for generating a CLKin/M (Signal "DivM").

It is understood that the multi-phase clock generator circuit having sub-pico-second granularity provided by the circuit 100 shown in FIG. 5 may include a delay line 100 of N=16, 32, 64 or 128 serially connected delay stages operating at different types of ClKin frequencies (e.g., 100 MHz to 1 GHz) and different propagation delays Tpds (sub-picoseconds) and resulting phase shifts (sub-picoseconds). The device is configurable for capturing a number M of clocks, including a prime number or odd number of clock signals such that N=xM where x is a non-integer value. In the example apparatus 100, a control structure that can phase lock the N=32 delay blocks over M=3 system cycles is provided. Further shown in FIG. 5, decoding logic circuitry is provided that can single out each one or more of the 32 clock phase edges that are essentially uniformly distributed in a single cycle from the edge placements that were originally only located in one of the three consecutive original cycles.

Figure 6:
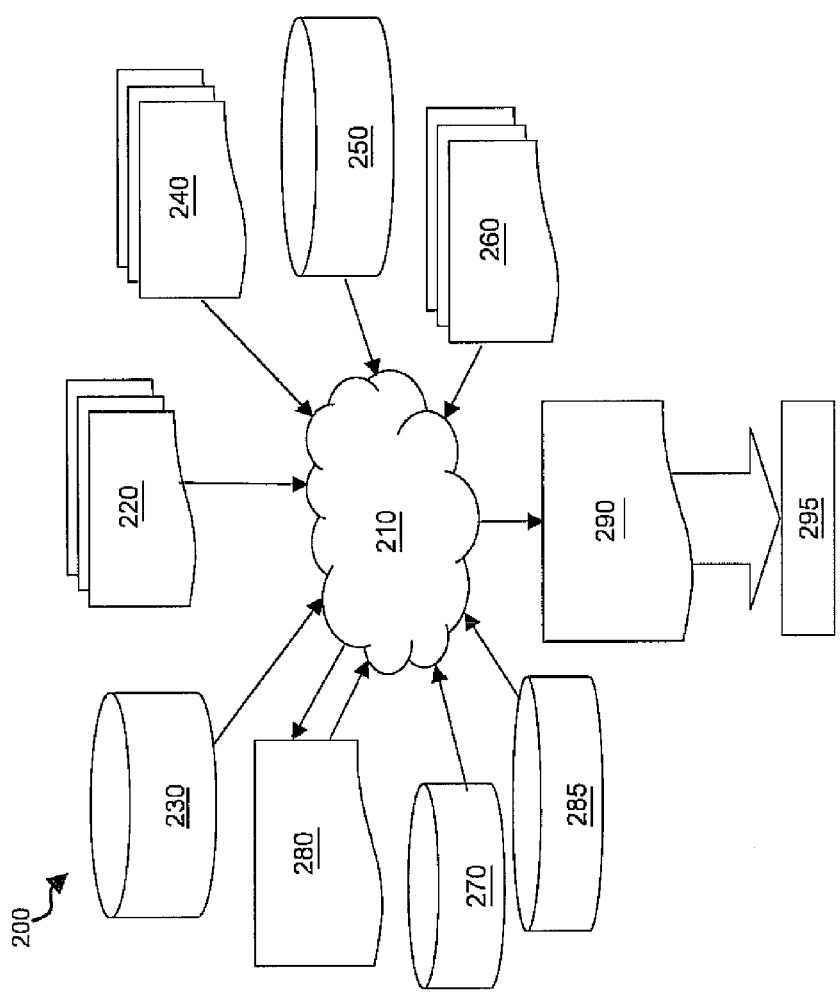

FIG. 6 shows a block diagram of an example design flow 200. Design flow 200 may vary depending on the type of integrated circuit (IC) being designed. For example, a design flow 200 for building an application specific IC (ASIC) having a multiphase clock generator of the present invention may differ from a design flow 200 for designing a standard component. Design structure 220 is preferably an input to a design process 210 and may come from an IP provider, a core developer, or other design company or may be generated by the operator of the design flow, or from other sources. Design structure 220 comprises the multiphase clock generator circuit 100 having sub-picosecond granularity in its various embodiments, as described herein, in the form of schematics or HDL, a hardware-description language (e.g., Verilog, VHDL, C, etc.). Design structure 220 may be contained on one or more machine readable medium. For example, design structure 220 may be a text file or a graphical representation of the CMOS imager device circuitry having electrically active optical elements in its various embodiments 200, 300. Design process 210 preferably synthesizes (or translates) the CMOS imager device circuitry having electrically active optical elements in its various embodiments into a netlist 280, where netlist 280 is, for example, a list of wires, transistors, logic gates, control circuits, I/O, models, etc. that describes the connections to other elements and circuits in an integrated circuit design and recorded on at least one of machine readable medium. This may be an iterative process in which netlist 280 is re-synthesized one or more times depending on design specifications and parameters for the circuit.

Design process 210 may include using a variety of inputs; for example, inputs from library elements 230 which may house a set of commonly used elements, circuits, and devices, including models, layouts, and symbolic representations, for a given manufacturing technology (e.g., different technology nodes, 32 nm, 45 nm, 90 nm, etc.), design specifications 240, characterization data 250, verification data 260, design rules 270, and test data files 285 (which may include test patterns and other testing information). Design process 210 may further include, for example, standard circuit design processes such as timing analysis, verification, design rule checking, place and route operations, etc. One of ordinary skill in the art of integrated circuit design can appreciate the extent of possible electronic design automation tools and applications used in design process 210 without deviating from the scope and spirit of the invention. The design structure of the invention is not limited to any specific design flow.

Ultimately, design process 210 preferably translates the multiphase clock generator circuit 100 having sub-picosecond granularity in its various embodiments, along with the rest of the integrated circuit design (if applicable), into a final design structure 290 (e.g., information stored in a GDS storage medium). Final design structure 290 may comprise information such as, for example, test data files, design content files, manufacturing data, layout parameters, wires, levels of metal, vias, shapes, test data, data for routing through the manufacturing line, and any other data required by a semiconductor manufacturer to produce the multiphase clock generator circuit 100 having sub-picosecond granularity in its various embodiments. Final design structure 290 may then proceed to a stage 295 where, for example, final design structure 290: proceeds to tape-out, is released to manufacturing, is sent to another design house or is sent back to the customer.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

The invention claimed is:

1. A sub-picosecond multi-phase clock generator comprising:
   an N-stage delay locked loop (DLL) having N serially connected variable delay stages and including phase detector feedback control device for controlling a delay of said N-stages to lock a clock input signal therein, said DLL initially receiving a clock signal (CLK/M) input equal to said clock input signal (CLK) divided by M, where M is a prime number greater than 1 and $N = X \cdot M$ and X is a non-integer value>1, and locking said CLK/M clock signal input;

a counter device receiving said CLK clock input signal and counting a predetermined time corresponding to a time for locking said CLK/M clock signal input in said DLL and asserting a switch signal at said predetermined time;

a synchronization device responsive to said asserted switch signal for switching said DLL input from said CLK/M clock signal input to said CLK clock signal input signal, and during input of a first cycle of said CLK clock input signal signal to said DLL generating a signal for temporarily halting said phase detector feedback control device from performing said DLL locking operation while enabling injection of M clock cycles in said DLL during said temporary halting, said synchronization device further enabling said phase detector feedback control device to resume said DLL locking operation at a time corresponding to input of said Mth additional CLK signal additional cycle of said CLK clock input signal such that said N-stage delay locked loop locks M number of CLK clock signals to form multiphase clock outputs having Tpd/M clock spacing, where Tpd is a propagation delay of each DLL stage.

\* \* \* \* \*